United States Patent
Mori et al.

(10) Patent No.: US 7,423,902 B2
(45) Date of Patent: Sep. 9, 2008

(54) STORAGE DEVICE AND SEMICONDUCTOR APPARATUS

(75) Inventors: Hironobu Mori, Nagasaki (JP); Hidenari Hachino, Nagasaki (JP); Nobumichi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/420,290

(22) Filed: May 25, 2006

(65) Prior Publication Data
US 2007/0153564 A1    Jul. 5, 2007

(30) Foreign Application Priority Data
Jun. 2, 2005    (JP)    ............... 2005-162307

(51) Int. Cl.
G11C 11/14    (2006.01)
(52) U.S. Cl. .................. 365/171; 365/46; 365/163; 365/48; 365/50
(58) Field of Classification Search .......... 365/148, 365/163, 171, 48, 50, 46
See application file for complete search history.

(56) References Cited

U.S. PATENT DOCUMENTS

| 5,761,115 | A | 6/1998 | Koziicki et al. |
| 6,473,332 | B1 * | 10/2002 | Ignatiev et al. ............... 365/148 |
| 2004/0027901 | A1 * | 2/2004 | Shiga et al. .................. 365/222 |

FOREIGN PATENT DOCUMENTS

| JP | 2002-536840 | 10/2002 |
| JP | 2004-185754 | 7/2004 |
| JP | 2005-216387 | 8/2005 |

OTHER PUBLICATIONS

W. W. Zhuang et al.; Novell Colossal Magnetoresistive Thin Film Nonvolatile Resistance Random Access Memory (RRAM); IEEE; 2002.
A. Beck et al.; Reproducible switching effect in thin oxide films for memory applications; Applied Physics Letters; vol. 77, No. 1; Jul. 3, 2000.

* cited by examiner

Primary Examiner—Huan Hoang
Assistant Examiner—Jason Lappas
(74) Attorney, Agent, or Firm—Sonnenschein Nath & Rosenthal LLP

(57) ABSTRACT

A storage device includes memory cells disposed in a matrix. The memory cells each include a storage element whose resistance changes from a higher state to a lower state when an electric signal of a first threshold level or higher is applied and whose resistance changes from the lower state to the higher state when an electric signal of a second threshold level or higher whose polarity is different from the polarity of the electric signal of the first threshold level or higher is applied, and a circuit element connected in series with the storage element. In a state in which an erasing voltage is applied to at least one memory cell on which erasing is currently being performed, after the lapse of a predetermined time from the application, an erasing voltage is applied to at least one memory cell on which erasing is to be next performed.

4 Claims, 9 Drawing Sheets

STORAGE DEVICE AND SEMICONDUCTOR APPARATUS

CROSS REFERENCES TO RELATED APPLICATIONS

The present invention contains subject matter related to Japanese Patent Application JP 2005-162307 filed in the Japanese Patent Office on Jun. 2, 2005, the entire contents of which are incorporated herein by reference.

BACKGROUND OF THE INVENTION

1. Field of the Invention

The present invention relates to storage devices and semiconductor apparatuses, and more particularly, to a storage device and a semiconductor apparatus that include memory cells each including a storage element storing and holding information in accordance with an electric resistance state.

2. Description of the Related Art

In information apparatuses, such as computers, high-density dynamic random access memories (DRAMs) with high operation speed are widely used as random access memories (RAMs).

However, since DRAMs are volatile memories, which lose information when the power is turned off, nonvolatile memories, which hold information even after the power is turned off, are desired.

Thus, ferroelectric random access memories (FeRAMs), magnetic random access memories (MRAMs), phase change memories, and resistance change memories, such as programmable metallization cells (PMCs) and resistance random access memories (RRAMs), are suggested as promising nonvolatile memories.

Such nonvolatile memories are capable of holding written information for a long time without supplying power. In addition, since a refresh operation is not necessary for nonvolatile memories, the power consumption can be reduced.

The resistance change nonvolatile memories, such as PMCs and RRAMs, have a relatively simple configuration in which a material having a characteristic in that the resistance changes by application of a voltage or a current is used for a storage layer storing and holding information and in which a voltage or a current is applied to two electrodes provided so as to sandwich the storage layer therebetween. Thus, miniaturization of a storage element can be easily achieved.

PMCs have a configuration in which an ionic conductor containing a predetermined metal is sandwiched between two electrodes, and the metal contained within the ionic conductor is also contained within one of the two electrodes. Thus, PMCs utilize a characteristic in which an electrical characteristic of the ionic conductor, such as resistance or capacitance, changes when a voltage is applied across the two electrodes.

More specifically, the ionic conductor is made of a solid solution of chalcogenide and metal (for example, amorphous GeS or amorphous GeSe), and one of the two electrodes contains Ag, Cu, or Zn (see, for example, PCT Japanese Translation Patent Publication No. 2002-536840).

A configuration of an RRAM, for example, in which a polycrystalline $PrCaMnO_3$ thin film is sandwiched between two electrodes and in which the resistance of the $PrCaMnO_3$ thin film, which is a recording film, greatly changes in accordance with application of voltage pulses or current pulses to the two electrodes is described, for example, in "Novel Colossal Magnetoresistive Thin Film Nonvolatile Resistance Random Access Memory (RRAM)" written by W. W. Zhuang et al. in Technical Digest "International Electron Devices Meeting", 2002, p. 193. A voltage pulse whose polarity changes depending on recording (writing) or erasing of information is applied.

Another configuration of an RRAM, for example, in which $SrZrO_3$ into which a small amount of Cr is doped (monocrystal or polycrystal) is sandwiched between two electrodes and in which the resistance of a recording film changes in accordance with currents flowing from the electrodes is described, for example, in "Reproducible Switching Effect in Thin Oxide Films for Memory Applications" written by A. Beck et al., in Applied Physics Letters, 2000, vol. 77, p. 139-141.

In this document, a current-voltage (I-V) characteristic of the storage layer is described, and threshold voltages in recording and erasing are $\pm 0.5$ V. With this configuration, information can be recorded and erased in accordance with application of voltage pulses. Necessary pulse voltages are $\pm 1.1$ V and a necessary voltage pulse width is 2 milliseconds. In addition, recording and erasing can be performed at high speed, and an operation can be performed with a voltage pulse width of 100 nanoseconds. In this case, necessary pulse voltages are $\pm 5$ V.

However, under the present situation, it is difficult for FeRAMs to perform nondestructive reading. Since FeRAMs perform destructive reading, the reading speed of FeRAMs is slow. In addition, since there is a restriction on the number of times polarization reversal according to reading or recording can be performed, the number of rewritable times is limited.

MRAMs use a magnetic field for recording, and a current flowing through wiring generates the magnetic field. Thus, a large amount of current is necessary for recording.

Phase change memories, which perform recording by application of voltage pulses with the same polarity and different sizes, perform switching depending on temperature. Thus, phase change memories are susceptible to changes in the ambient temperature.

In the PMC described in PCT Japanese Translation Patent Publication No. 2002-536840, the crystallization temperature of amorphous GeS or amorphous GeSe is about 200° C., and a characteristic is deteriorated when an ionic conductor is crystallized. Thus, the PMC does not endure high temperature in an actual process for manufacturing a storage element, for example, a process for forming a chemical vapor deposition (CVD) insulating film or a protection film.

A material of a storage layer suggested for the RRAM described in each of the document titled "Novel Colossal Magnetoresistive Thin Film Nonvolatile Resistance Random Access Memory (RRAM)" and the document titled "Reproducible Switching Effect in Thin Oxide Films for Memory Applications" is crystalline. Thus, processing at a temperature of about 600° C. is necessary, it is extremely difficult to manufacture monocrystal of the suggested material, and miniaturization is difficult due to the influence of grain boundary when polycrystal is used.

In addition, although recording and erasing of information performed by application of pulse voltages is suggested for the above-described RRAMs, the resistance of the storage layer after recording changes depending on the pulse width of the applied pulse voltage in the suggested configurations. In addition, the fact that the resistance after recording depends on the pulse width for the recording indirectly indicates that the resistance changes even when the same pulse is repeatedly applied.

For example, as reported in the document titled "Novel Colossal Magnetoresistive Thin Film Nonvolatile Resistance Random Access Memory (RRAM)", when pulses with the same polarity are applied, the resistance after recording greatly changes depending on the pulse width. When the pulse width is shorter, such as less than 50 nanoseconds, the resistance change ratio by recording is lower. When the pulse width is longer, such as more than 100 nanoseconds, instead of being saturated at a constant value, a resistance closer to the resistance before recording is acquired as the pulse width increases. In addition, the document titled "Novel Colossal Magnetoresistive Thin Film Nonvolatile Resistance Random Access Memory (RRAM)" describes features of the memory configuration in which a storage layer is connected in series with a metal-oxide semiconductor (MOS) transistor for access control and in which the storage layer and the MOS transistor are disposed in an array form. When the pulse width changes within a range between 10 nanoseconds and 100 nanoseconds, the resistance of the storage layer after recording changes depending on the pulse width. If the pulse width is much longer, it is predicted, from the characteristic of the storage layer, that the resistance decreases again.

In other words, RRAMs have a feature in which the resistance after recording depends on the size of a pulse voltage and a pulse width. Thus, variations in the size of the pulse voltage and in the pulse width cause variations in the resistance after recording.

Thus, a pulse voltage with a pulse width shorter than about 100 nanoseconds has a lower resistance ratio by recording and is susceptible to variations in the resistance after recording. Thus, it is difficult to perform stable recording.

Thus, when recording is performed using such a pulse voltage with a shorter pulse width, it is necessary to perform a process for verifying the content of information after recording is performed, in order to reliably perform recording.

For example, before recording, a process for reading and verifying the content of information that has already been recorded in a storage element (the resistance of a storage layer) is performed. Then, recording is performed so as to correspond to the relationship between the verified content (resistance) and the content (resistance) to be recorded. Alternatively, for example, after recording, a process for reading and verifying the content of information recorded in the storage element is performed. If the verified resistance is different from a desired resistance, re-recording is performed to correct the verified resistance to the desired resistance.

Thus, a longer period of time is spent for recording, and, for example, it is difficult to perform overwriting of data or the like at high speed.

In order to solve such problems, a storage device is suggested, for example, in Japanese Patent Application No. 2004-22121. In the storage device, a memory cell includes a storage element having a characteristic in which the resistance changes in accordance with application of a voltage of a threshold level or higher across both ends and a circuit element that is connected in series with the storage element and that serves as a load. The storage device has a characteristic in which, when the voltage applied across ends of the storage device and the circuit element is the threshold level or higher, the combined resistance of the storage element and the circuit element of the memory cell after the resistance of the storage element changes from a higher state to a lower state is substantially constant irrespective of the size of the voltage. Such a storage device realizes a stable recording operation, and reduces the period of time necessary for recording of information.

When an operation for changing the resistance of the storage element from a higher state to a lower state is defined as "writing" and an operation for changing the resistance of the storage element from the lower state to the higher state is defined as "erasing", a particular procedure for performing erasing on a plurality of memory cells from a memory array of, for example, the resistance change storage device described in Japanese Patent Application No. 2004-22121 is not available. Thus, erasing is performed by access to each bit.

An example of an erasing sequence of a known procedure is described next. In this example, a storage element on which erasing is performed by application of a voltage (erasing voltage) of about 0.5 V across ends of the storage element and a circuit element (access transistor) is described.

In the erasing sequence of the known procedure, first, an address to be erased is set, and a bit line provided in the column direction and a word line provided in the row direction are determined. Then, a potential difference of 0.5 V or more is generated across a selected memory cell. Then, as a gate voltage of an access transistor of the selected memory cell, a voltage of Vth or more (Vth is the minimum voltage at which an inversion layer starts to be formed on a channel region surface by application of the gate voltage) is applied, and an erasing voltage necessary for erasing is generated across the memory cell. After erasing is performed on the memory cell by application of the erasing voltage to the memory cell, the gate voltage of the access transistor of the memory cell is reduced to less than Vth. Accordingly, erasing is completed. Then, in order to perform erasing on another memory cell, another memory address is set, and erasing on the memory cell is performed, as in the sequence described above.

More specifically, referring to FIG. 8, an example in which erasing is performed on a memory cell a, a memory cell b, a memory cell c, and so on in that order will be described. FIG. 9 is a schematic diagram for explaining the potential of each word line. In the initial state, the potential of all the word lines is 0 V.

Referring to FIG. 8, in order to perform erasing on the memory cell a, a potential of 0 V is applied to a bit line B0, a potential of 1 V is applied to the other bit lines (B1, B2, . . . , and Bn), and a potential of 1 V is applied to a source line S. In such a state, at time t1, a potential of Vth or more is applied to a word line W0, and a potential difference of 1.0 V is generated across the memory cell a. Accordingly, erasing on the memory cell a starts. At time t2, which is after the lapse of about 20 nanoseconds from time t1 (erasing ends by time t2), the potential of the word line W0 is returned to 0 V, and erasing on the memory cell a is completed.

Then, in order to perform erasing on the memory cell b, at time t3, a potential of Vth or more is applied to a word line W1, and a potential difference of 1.0 V is generated across the memory cell b. Accordingly, erasing on the memory cell b starts. Then, at time t4, which is after the lapse of about 20 nanoseconds from time t3 (erasing ends by time t4), the potential of the word line W1 is returned to 0 V, and erasing on the memory cell b is completed.

Then, in order to perform erasing on the memory cell c, at time t5, a potential of Vth or more is applied to a word line W2, and a potential difference of 1.0 V is generated across the memory cell c. Accordingly, erasing on the memory cell c starts. Then, at time t6, which is after the lapse of about 20 nanoseconds from time t5 (erasing ends by time t6), the potential of the word line W2 is returned to 0 V, and erasing on the memory cell c is completed.

Similarly, for the bit line B0, erasing on memory cells is sequentially performed.

In addition, in order to perform erasing on memory cells connected to the bit line Bn, a potential of 0V is applied to the bit line Bn, a potential of 1 V is applied to the other bit lines, and a potential of 1 V is applied to the source line S. In such a state, erasing on the memory cells connected to the bit line Bn is performed in accordance with a sequence similar to the erasing procedure for the memory cells connected to the bit line B0.

In FIG. 9, sign "P" represents the electric energy consumed by the memory array. When erasing on a memory cell is performed in accordance with the above-mentioned sequence, predetermined electric energy is consumed immediately (about 1 nanosecond) after a potential difference (erasing voltage) of 1.0 V is generated across the memory cell by application of a potential of Vth or more to a word line, and, after that, hardly any electric energy is consumed. This is because, for a large majority of memory cells, erasing is completed immediately (about 1 nanosecond) after the erasing voltage is applied.

When taking into consideration the fact that, for a large majority of memory cells, erasing is completed by application of an erasing voltage for about 1 nanosecond, that is, when taking into consideration the fact that about 1 nanosecond is spent from application of an erasing voltage to completion of erasing, about 1 nanosecond is sufficient for an application time of an erasing voltage. However, some memory cells spend an erasing time of about 20 nanoseconds. Thus, in order to reliably perform erasing by a single application of an erasing voltage, it is necessary to provide an erasing time of at least about 20 nanoseconds. Thus, an application time of an erasing voltage is about 20 nanoseconds.

SUMMARY OF THE INVENTION

However, in the erasing sequence mentioned above, when erasing is performed for a memory array, it is necessary to set an address for each memory cell. Thus, a large amount of time is necessary for erasing.

A technology for performing batch erasing for the entire memory array in an RRAM, which is a resistance change storage device, is described in Japanese Unexamined Patent Application Publication No. 2004-185754. Thus, with this technology, theoretically, an erasing time for a memory cell can be reduced. However, as the capacity of the storage device increases, the power consumption necessary for batch erasing enormously increases. Thus, it is, in effect, difficult to perform batch erasing.

Accordingly, it is desirable to provide a storage device and a semiconductor apparatus capable of reducing power consumption when erasing is performed on a memory cell and reducing an erasing time for the memory cell.

A storage device according to an embodiment of the present invention includes a plurality of memory cells disposed in a matrix. Each of the plurality of memory cells includes a storage element having a characteristic in that the resistance thereof changes from a higher state to a lower state when an electric signal of a first threshold level or higher is applied and in that the resistance changes from the lower state to the higher state when an electric signal of a second threshold level or higher, the polarity of the electric signal of the second threshold level or higher being different from the polarity of the electric signal of the first threshold level or higher, is applied, and a circuit element connected in series with the storage element. In order to perform erasing on the memory cells, in a state in which an erasing voltage is applied to a predetermined unit including at least one memory cell on which erasing is currently being performed, after the lapse of a predetermined period of time since the application of the erasing voltage to the predetermined unit including the memory cell on which erasing is currently being performed, an erasing voltage is applied to a predetermined unit including at least one memory cell on which erasing is to be next performed.

A semiconductor apparatus according to an embodiment of the present invention including a plurality of memory cells disposed in a matrix, each of the plurality of memory cells including a storage element having a characteristic in that the resistance thereof changes from a higher state to a lower state when an electric signal of a first threshold level or higher is applied and in that the resistance changes from the lower state to the higher state when an electric signal of a second threshold level or higher, the polarity of the electric signal of the second threshold level or higher being different from the polarity of the electric signal of the first threshold level or higher, is applied, and a circuit element connected in series with the storage element includes erasing voltage applying means in which, in order to perform erasing on the memory cells, in a state in which an erasing voltage is applied to a predetermined unit including at least one memory cell on which erasing is currently being performed, after the lapse of a predetermined period of time since the application of the erasing voltage to the predetermined unit including the memory cell on which erasing is currently being performed, an erasing voltage is applied to a predetermined unit including at least one memory cell on which erasing is to be next performed.

In a state in which an erasing voltage is applied to a predetermined unit including at least one memory cell on which erasing is currently being performed, after the lapse of a predetermined period of time since the application of the erasing voltage to the predetermined unit including the memory cell on which erasing is currently being performed, the predetermined period of time being necessary for completing erasing of a majority of the predetermined unit including the memory cell on which erasing is currently being performed, an erasing voltage is applied to a predetermined unit including at least one memory cell on which erasing is to be next performed. Thus, an erasing voltage is applied to a memory cell on which erasing is completed, and at the same time, an erasing voltage is applied to a memory cell on which erasing is not completed.

Since an operation for changing the resistance of a storage element from a lower state to a higher state is defined as erasing, performing erasing changes the resistance of the storage element into the higher state. This means that hardly any voltage drop due to the storage element on which erasing is completed occurs. Thus, even if an erasing voltage is applied to a memory cell on which erasing is completed and an erasing voltage is applied to a memory cell on which erasing is not completed in a superimposing manner, power consumption is not much increased.

According to the storage device and the semiconductor apparatus, power consumption can be reduced, and erasing on a memory array can be performed at high speed.

DESCRIPTION OF THE PREFERRED EMBODIMENTS

Embodiments of the present invention will be described with reference to the drawings.

In the embodiments of the present invention, a storage device includes a resistance change storage element (hereinafter, referred to as a memory element) used for a memory cell.

Figure 1:
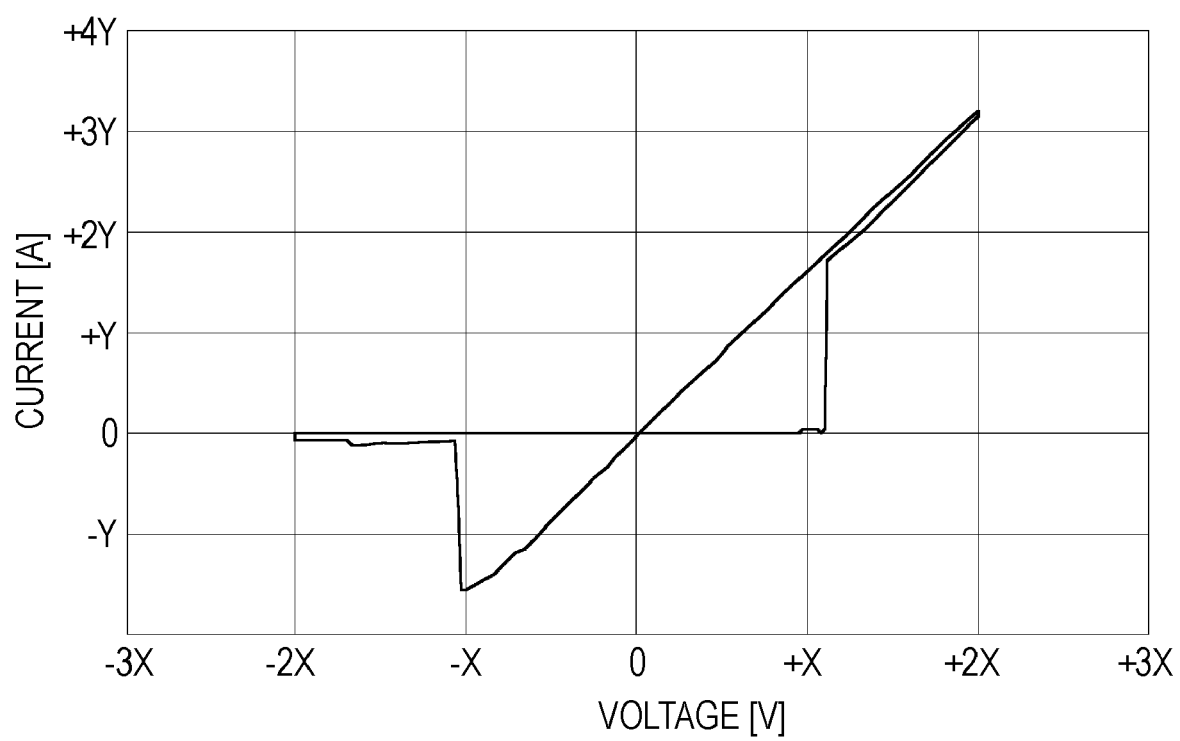
FIG. 1 is a graph showing a current-voltage change in a memory element used in a storage device according to an embodiment of the present invention.

FIG. 1 is a graph showing a current-voltage (I-V) change of a memory element used in a storage device according to an embodiment of the present invention.

As a memory element having the I-V characteristic shown in FIG. 1, for example, a storage element including a storage layer that is sandwiched between a first electrode and a second electrode (for example, between a lower electrode and an upper electrode) and that is made of an amorphous thin film, such as a rare-earth oxide film or the like, is used.

In the initial state, the memory element has a high resistance (for example, 1 MΩ or more), and a current does not flow easily. Referring to FIG. 1, when a voltage of +1.1X V (for example, +0.5 V) or more is applied, a current suddenly increases, and a resistance decreases (for example, several kΩ). Then, the memory element reaches Ohmic features. A current flows in proportion to a voltage, that is, a resistance has a constant value. Then, even if the voltage is returned to 0 V, the constant resistance (lower resistance) is maintained.

Hereinafter, this operation is referred to as "writing", and this state is referred to as "conduction". In addition, the applied voltage at this time is referred to as a "writing voltage threshold".

A voltage whose polarity is opposite to that for writing is applied to the memory element, and the applied voltage is increased. At a voltage of −1.1X V (for example, −0.5 V), the current flowing to the memory element suddenly decreases, that is, a resistance suddenly increases to a high resistance (for example, 1 MΩ or more) that is equal to that in the initial state. Then, even if the voltage is returned to 0 V, the resistance (higher resistance) is maintained.

Hereinafter, this operation is referred to as "erasing", and this state is referred to as "insulation". In addition, the applied voltage at this time is referred to as an "erasing voltage threshold".

By applying positive and negative voltages to the memory element as describe above, the resistance of the memory element can be reversibly changed from several kΩ to about 1 MΩ. In addition, when no voltage is applied to the memory element, that is, the voltage is 0 V, a conduction state or an insulation state can be entered. By associating the conduction state with data 1 and by associating the insulation state with data 0, 1-bit data can be stored.

In FIG. 1, an applied voltage is within a range between −2X and +2X. However, even if a voltage higher than +2X is applied, a memory element used in the storage device according to this embodiment has substantially the same resistance.

Figure 2A:
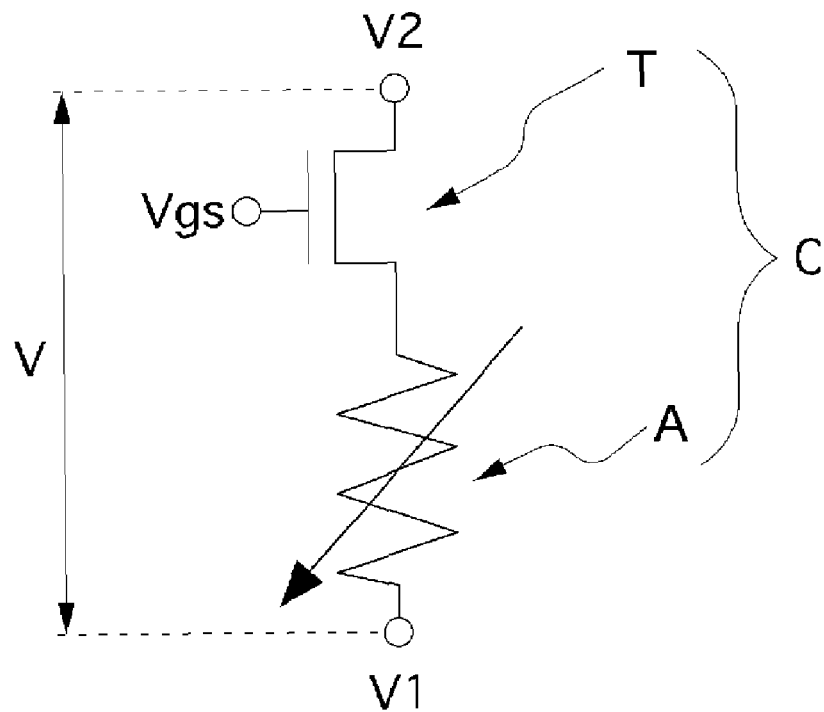
FIGS. 2A and 2B are circuit diagrams for explaining a memory cell used in the storage device according to the embodiment.
Figure 2B:
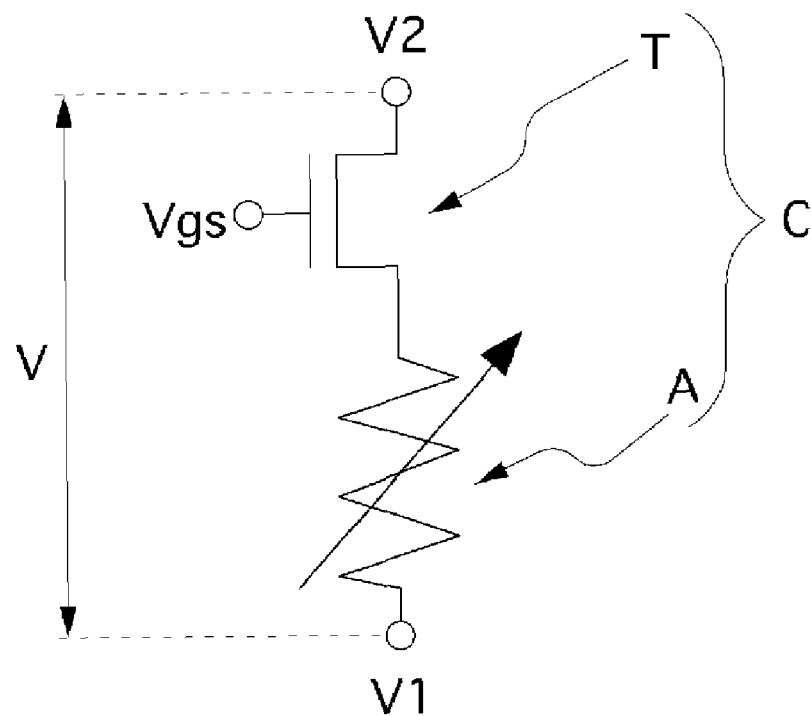

FIGS. 2A and 2B are circuit diagrams for explaining a memory cell C used in the storage device according this embodiment. Referring to FIGS. 2A and 2B, the memory cell C includes a memory element A and a MOS transistor T that are connected in series with each other. Thus, the MOS transistor T serves not only as a switching element for selecting the memory element A to be accessed but also as a load for the memory element A.

A terminal voltage V1 is applied to a terminal of the memory element A that is opposite to a terminal connected to the MOS transistor T. A terminal voltage V2 is applied to a terminal of the MOS transistor T (for example, a terminal in the source side) that is opposite to a terminal connected to the memory element A. A gate voltage Vgs is applied to the gate of the MOS transistor T.

Since the terminal voltages V1 and V2 are applied across ends of the memory element A and the MOS transistor T of the memory cell C, a potential difference V (=|V2−V1|) is generated across the terminals.

It is desirable that the resistance of the memory element A when writing is performed be equal to or higher than the on-resistance of the MOS transistor T. This is because since a potential difference applied across the terminals is mostly applied to the MOS transistor T when the resistance of the memory element when erasing starts is low, the electric power is lost and the applied voltage is not efficiently used for changing of the resistance of the memory element A. Since the resistance of the memory element A when writing starts is sufficiently high, the voltage is mostly applied to the memory element A. Thus, such a problem does not occur.

In accordance with the polarity of the memory element A and the MOS transistor T, two types of configurations are considered for the memory cell C, as shown in FIGS. 2A and 2B.

In FIGS. 2A and 2B, the arrow provided on the memory element A represents a polarity. When a voltage is applied in the direction of the arrow, the memory element A is changed from the insulation state to the conduction state, that is, a writing operation is performed.

FIGS. 3 to 6 are circuit diagrams for explaining the storage device according to this embodiment. In a memory array shown in each of FIGS. 3 to 6, a plurality of memory cells (shown in FIG. 2A or 2B) is disposed in a matrix. In accordance with the polarity of the memory element A and the MOS transistor T and the positional relationship between the memory element A and the MOS transistor T, four types of configurations are considered for the memory array, as shown in FIGS. 3 to 6.

The same operation procedure is adopted for the memory arrays shown in FIGS. 3 to 6. Thus, the operation procedure of the memory array will be described using a circuit shown in FIG. 3 as an example.

Figure 3:
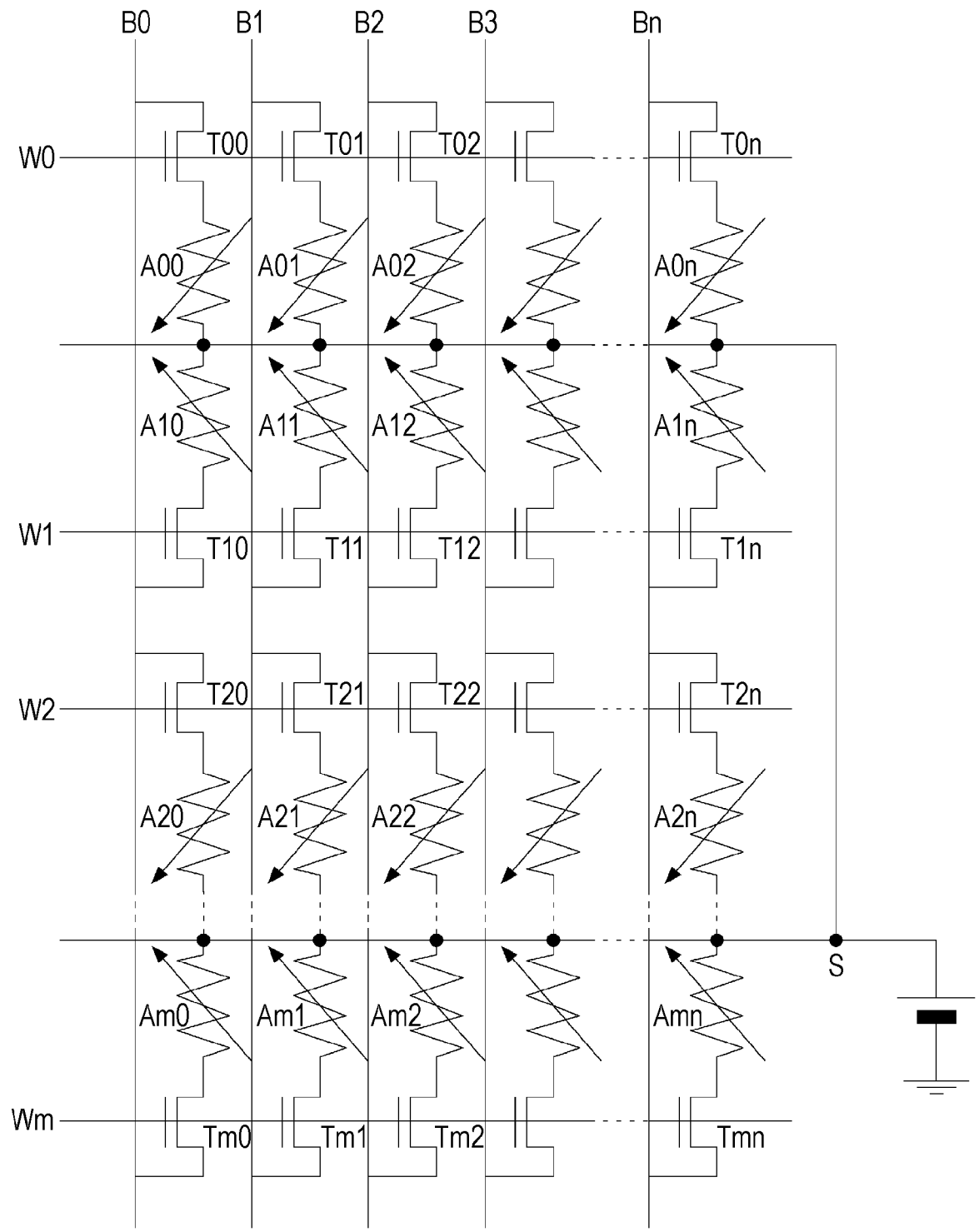
FIG. 3 is a circuit diagram for explaining an example of the storage device according to the embodiment.
Figure 4:
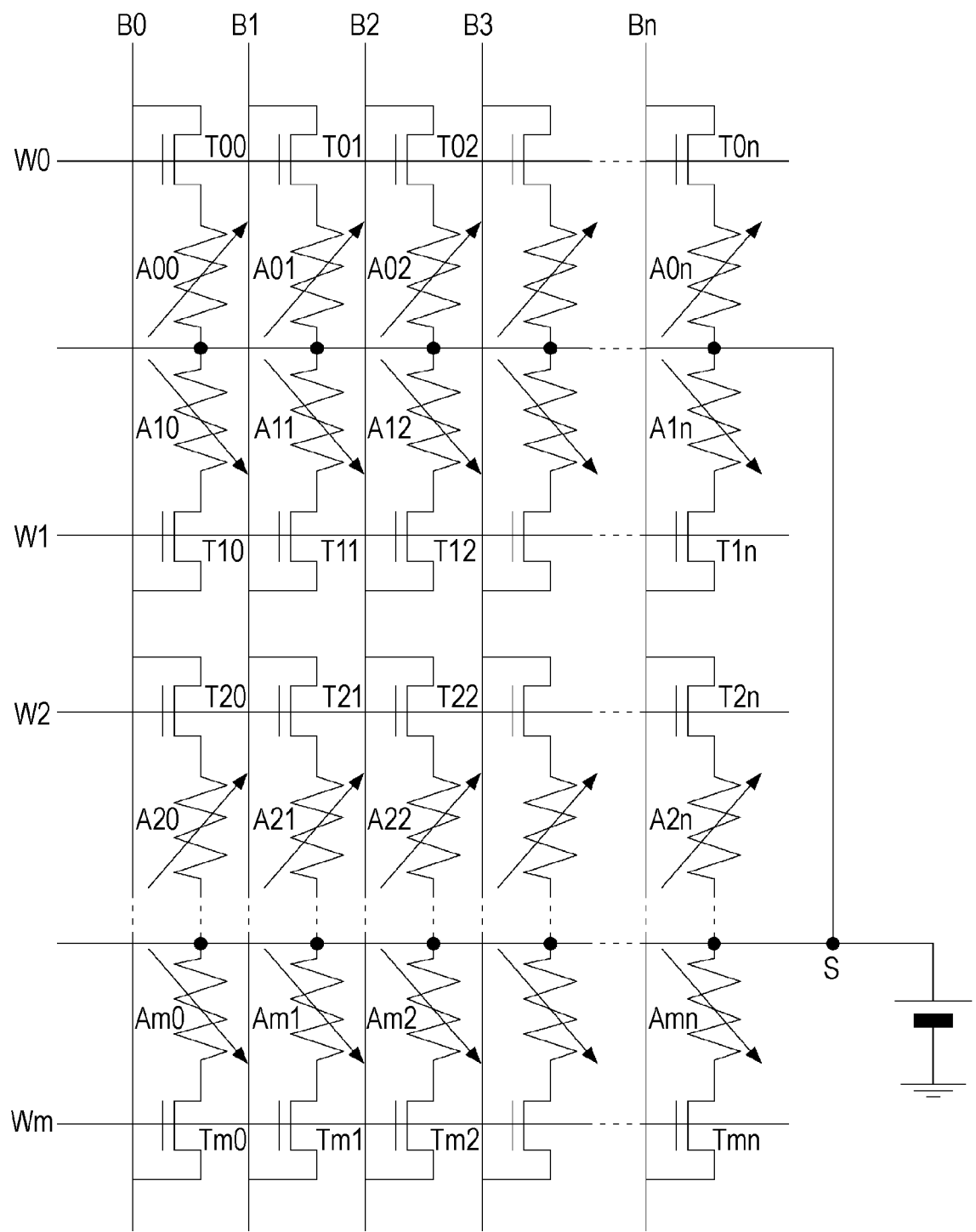
FIG. 4 is a circuit diagram for explaining another example of the storage device according to the embodiment.
Figure 5:
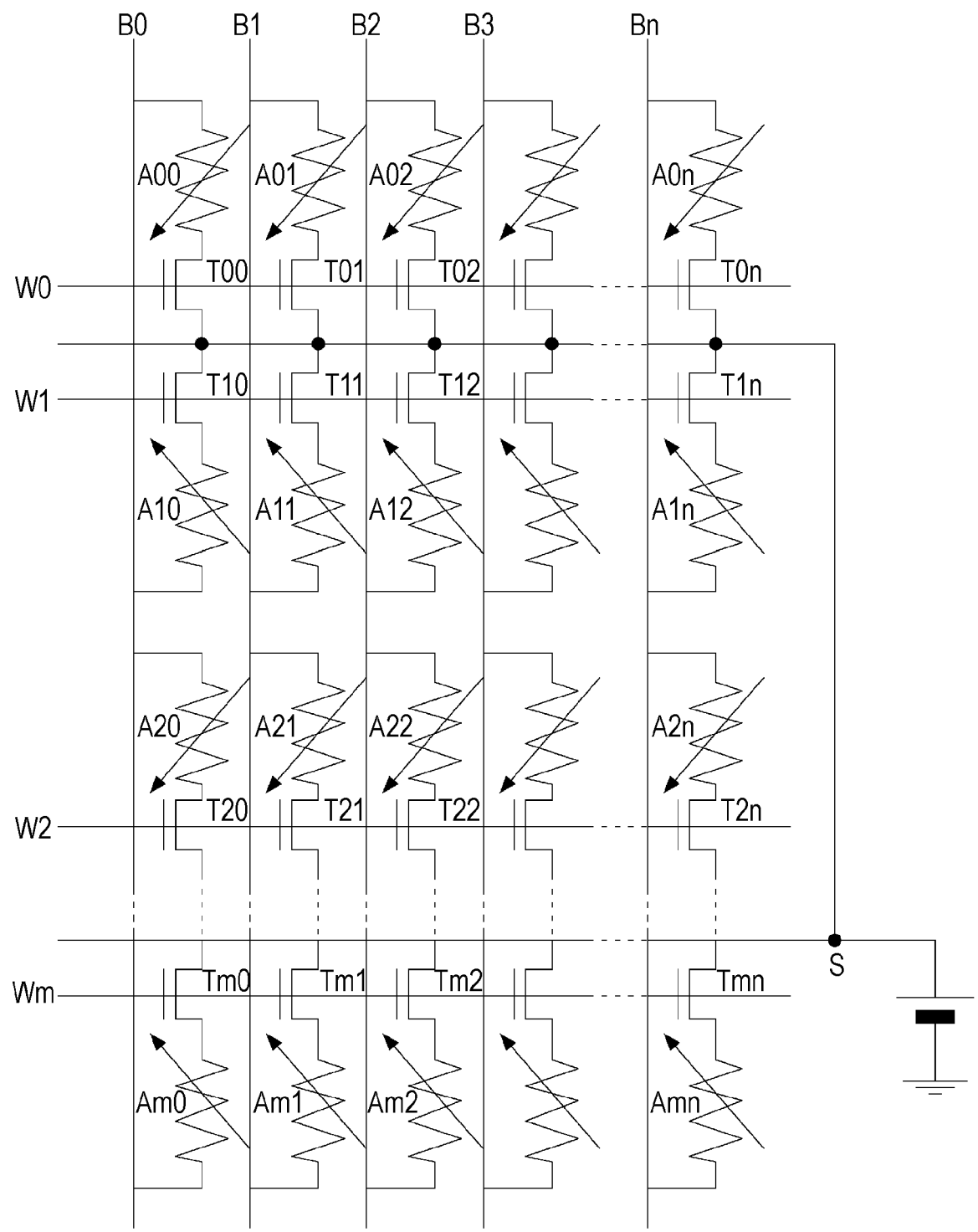
FIG. 5 is a circuit diagram for explaining another example of the storage device according to the embodiment.
Figure 6:
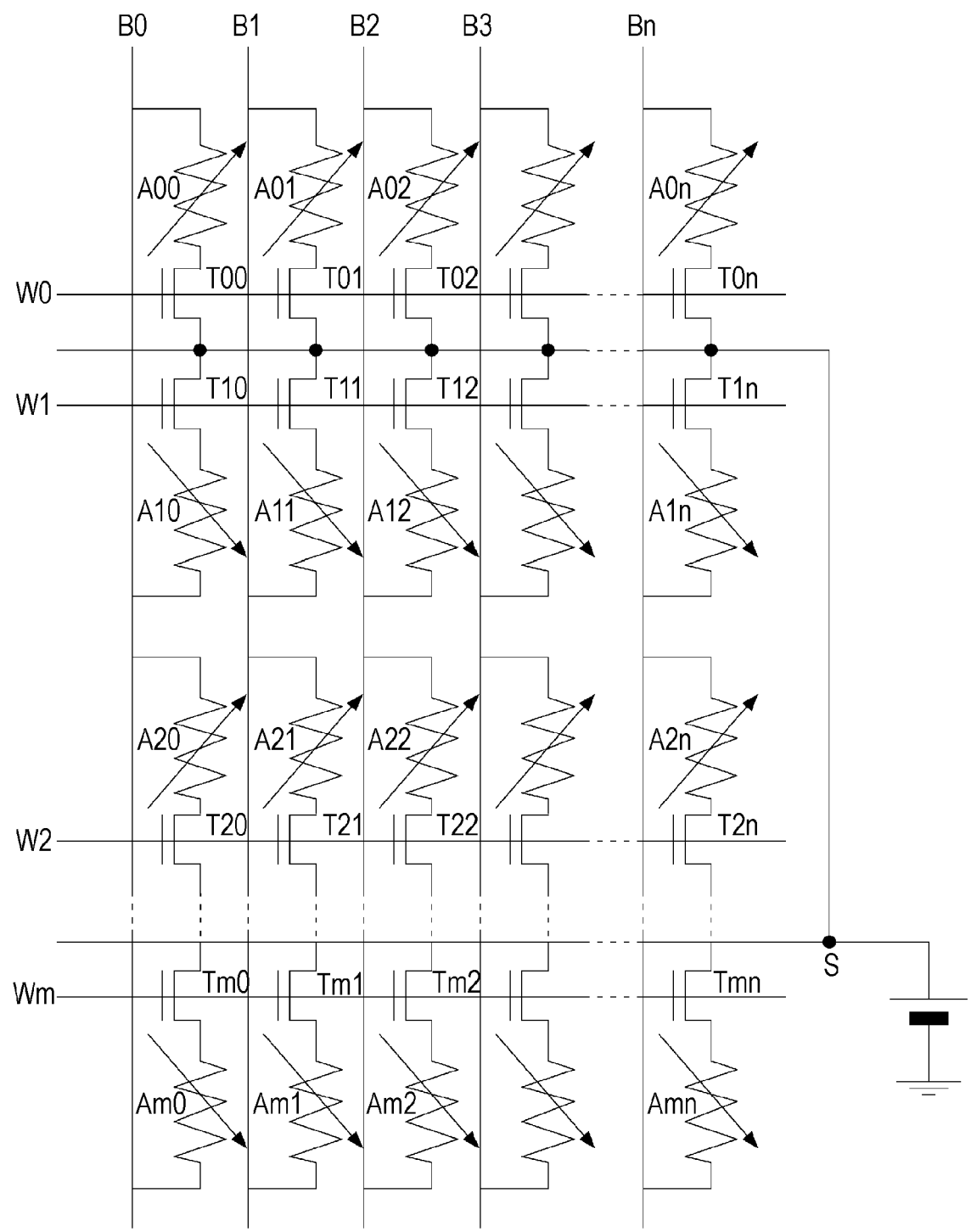
FIG. 6 is a circuit diagram for explaining another example of the storage device according to the embodiment.

The storage device shown in FIG. 3 includes memory cells of (m+1) rows and (n+1) columns disposed in a matrix. In each of the memory cells, one end of a memory element is connected to one end (here, a source) of a MOS transistor, as shown in FIGS. 2A to 2B.

The gates of MOS transistors T (T00 to Tmn) are connected to word lines W (W0 to Wm). The other ends (drains) of the MOS transistors T are connected to bit lines B (B0 to Bn). The other ends of memory elements are connected to source lines S (S0 to Sm).

Figure 7A:
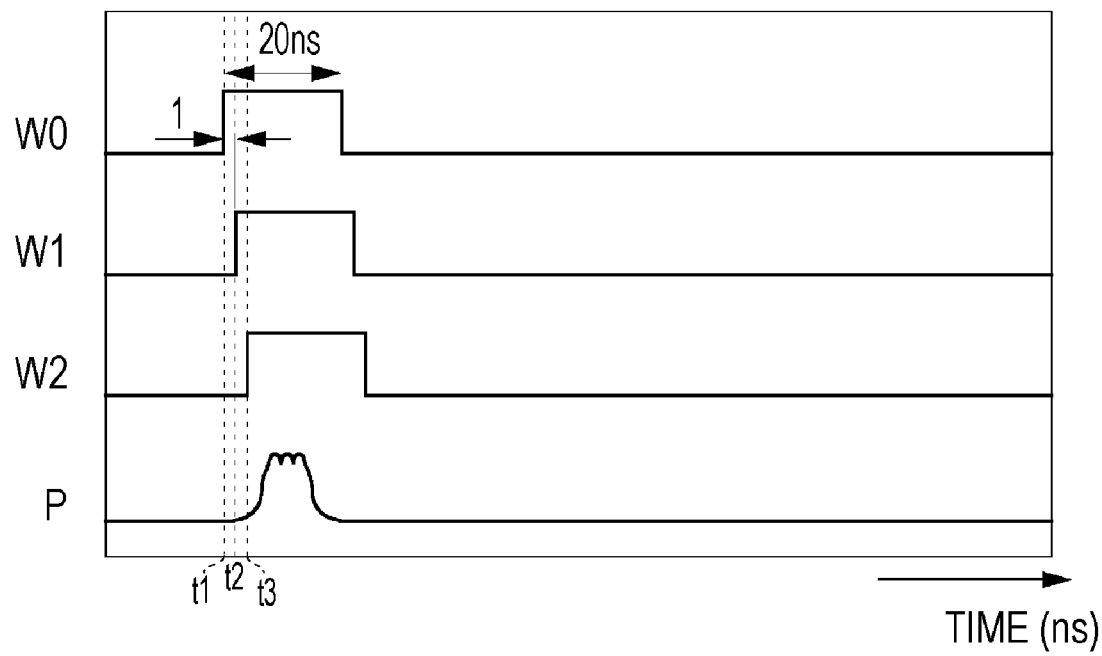
FIGS. 7A and 7B are schematic diagrams for explaining timing for applying a voltage to a memory cell.
Figure 7B:
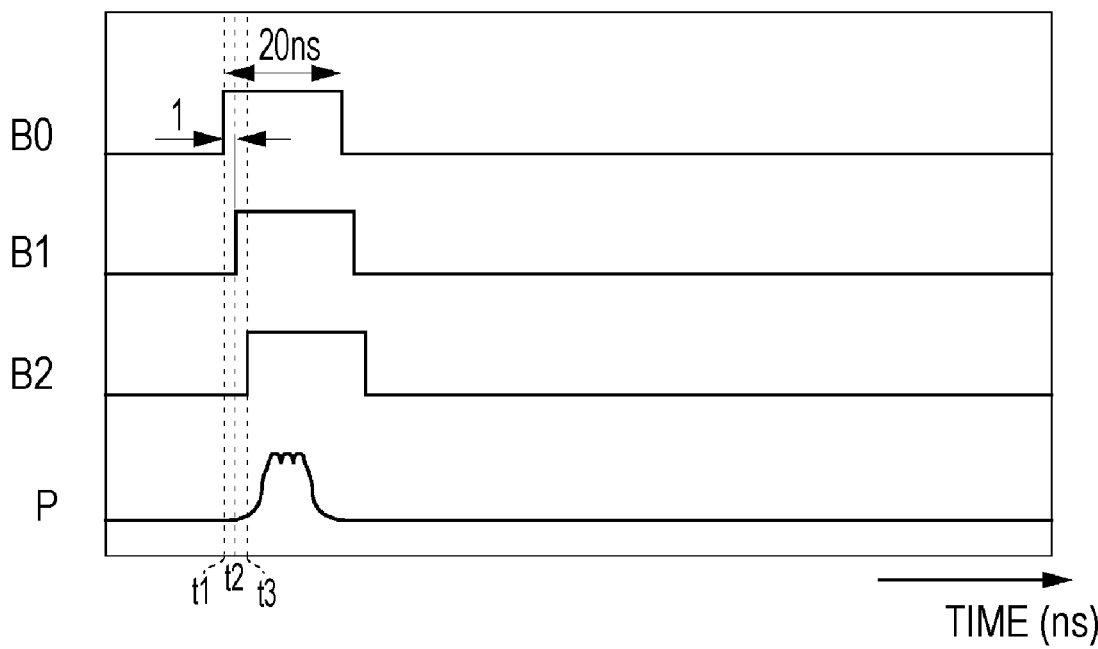
Figure 8:
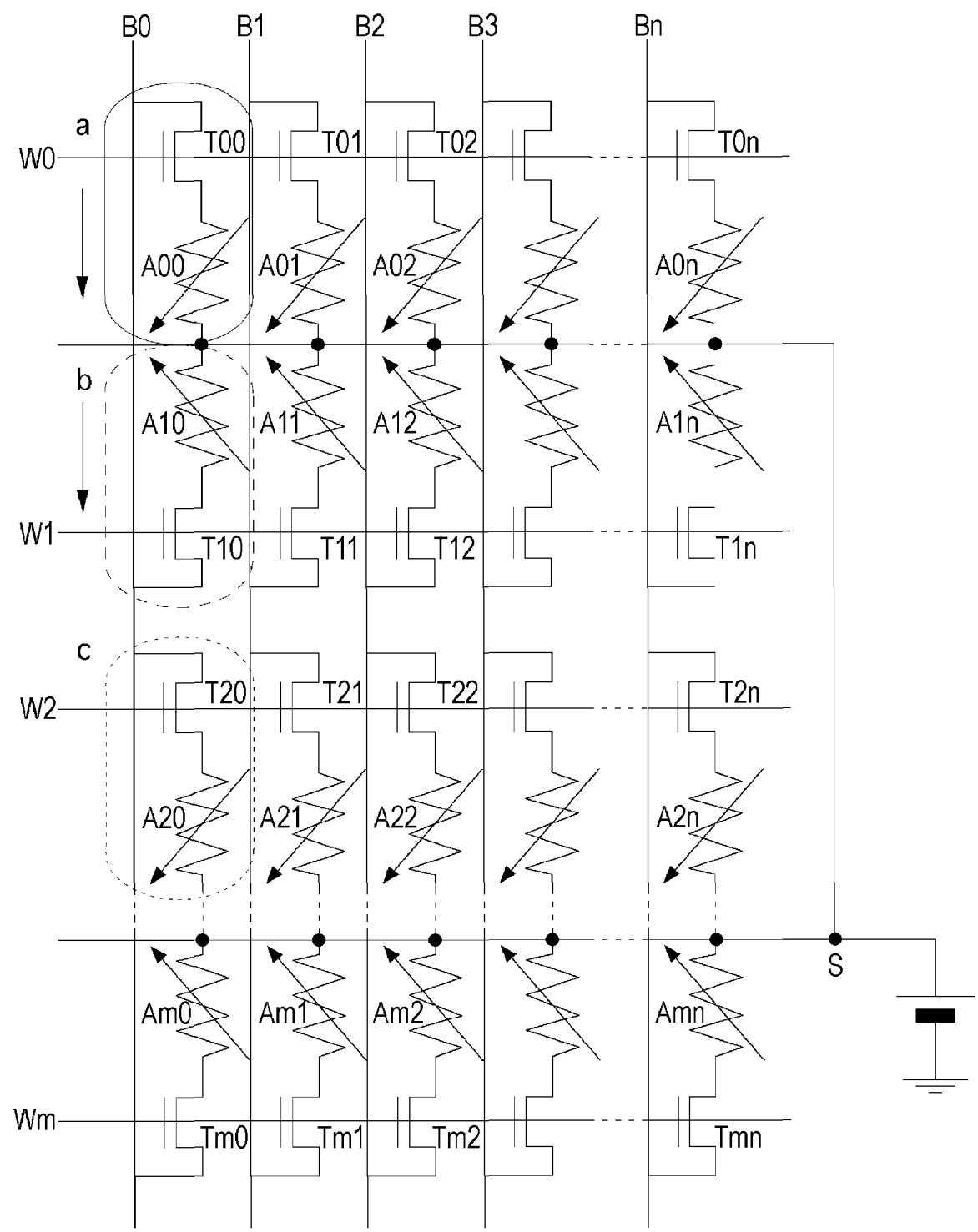
FIG. 8 is a circuit diagram for explaining an erasing sequence in a known procedure.
Figure 9:
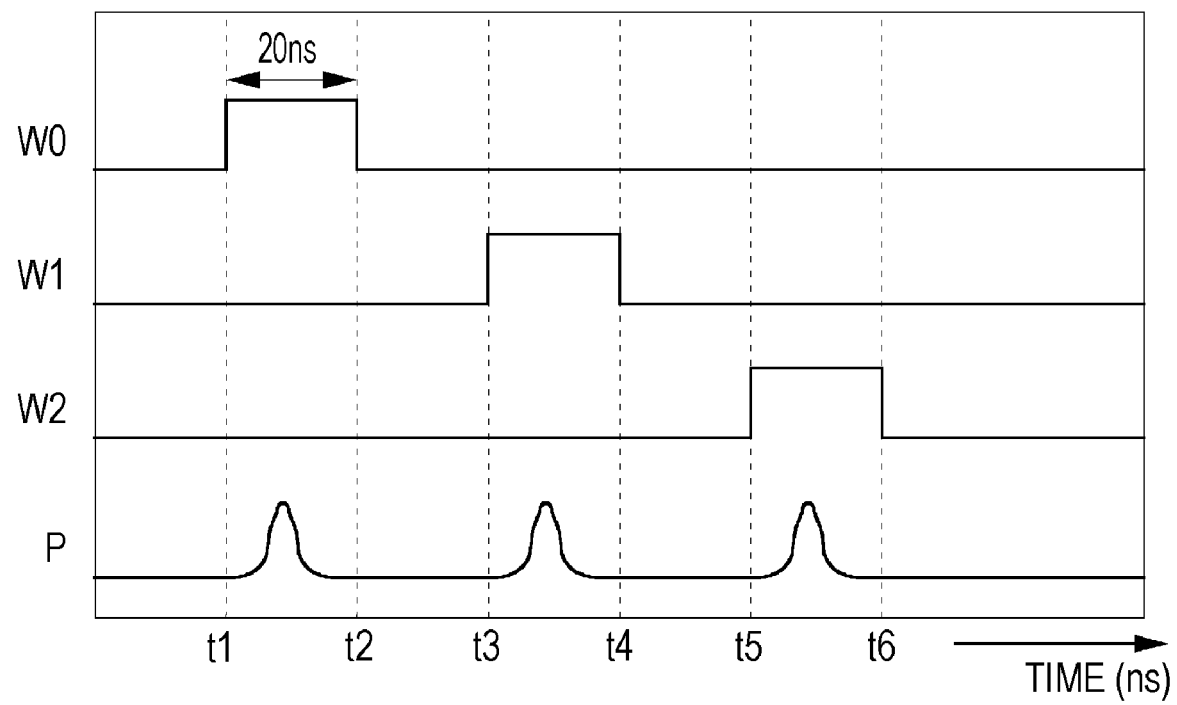
FIG. 9 is a schematic diagram for explaining timing for applying a voltage to a memory cell for erasing in the known procedure.

An erasing sequence performed by the storage device according to this embodiment will be explained for a case where erasing on memory cells is performed for each column and a case where erasing on memory cells is performed for each row. Hereinafter, a memory element on which erasing is performed by application of a voltage (erasing voltage) of about 0.5 V across the memory element and an MOS transistor will be described as an example. FIGS. 7A and 7B are schematic diagrams for explaining the potentials of word lines and bit lines. When erasing on memory cells is performed for each column, the potential of all the word lines is 0 V in the initial state. When erasing on memory cells is performed for each row, the potential of all the bit lines is 1 V in the initial state.

A case where erasing on memory cells is performed for each column will be described with reference to FIG. 7A.

When erasing on memory cells is performed for each column, that is, when erasing on memory elements A00, A10, . . . , and Am0 that are connected to a bit line B0 is performed in that order, and then, erasing on memory elements A01, A11, . . . , and Am1 that are connected to a bit line B1 is performed in that order, first, in order to perform erasing on the memory element A00, a potential of 1 V is applied to bit lines (B1, B2, . . . , and Bn) other than the bit line B0, and a potential of 1 V is applied to a source line S. In such a state, at time t1, a potential of 1.8 V is applied to a word line W0, and a potential difference of 1.0 V is generated across the memory cell including the memory element A00 and the MOS transistor T00.

Then, in order to perform erasing on the memory element A10, at time t2, which is after the lapse of about 1 nanosecond from time t1, a potential of Vth or more is applied to a word line W1, and a potential difference of 1.0 V is generated across the memory cell including the memory element A10 and the MOS transistor T10. At time t2, a potential of Vth or more is applied to the word line W0.

Then, in order to perform erasing on the memory element A20, at time t3, which is after the lapse of about 1 nanosecond from time t2, a potential of Vth or more is applied to a word line W2, and a potential difference of 1.0 V is generated across the memory cell including the memory element A20 and the MOS transistor T20. At time t3, a potential of Vth or more is applied to the word lines W0 and W1.

Then, similarly, after the lapse of about 1 nanosecond from a point in time at which a potential of Vth or more is applied to a word line connected to a memory cell on which erasing is currently being performed, a potential of Vth or more is applied to a word line connected to a memory cell on which erasing is to be next performed. Accordingly, erasing on the memory elements A00, A11, . . . , and Am1 that are connected to the bit line B0 is performed in that order. The potential of each word line is returned to 0 V after the lapse of about 20 nanoseconds from a point in time at which a potential of Vth or more is applied, and erasing of each memory cell is completed. More specifically, the potential of the word line W0 is returned to 0 V after the lapse of about 20 nanoseconds from time t1, and the potential of the word line W1 is returned to 0 V after the lapse of about 20 nanoseconds from time t2.

After erasing on the memory elements connected to the bit line B0 is performed as described above, in order to perform erasing on the memory element A01 connected to the bit line B1, the potential of the bit line B0 is set to 1 V, and the potential of the bit line B1 is set to 0V. Then, by performing a sequence similar to a case where erasing on the memory elements connected to the bit line B0 is performed, erasing on the memory elements A10, A11, . . . , and Am1 that are connected to the bit line B1 is performed in that order. Then, erasing on memory elements connected to each of the bit lines B2, B3, . . . , and Bn is performed in accordance with a similar sequence, and erasing on all the memory elements can be performed.

When erasing on memory cells is performed for a plurality of columns (for x columns), that is, when erasing on memory elements A00 to A0x, A10 to A1x, . . . , and Am0 to Amx that are connected to bit lines B0 to Bx (x≧2) is performed in that order, and then, erasing on memory elements A0(x+1) to A0(2x), A1(x+1) to A1(2x), . . . , and Am(x+1) to Am(2x) that are connected to bit lines B(x+1) to B(2x) is performed in that order, first, in order to perform erasing on the memory elements A00 to A0x, a potential of 1 V is applied to bit lines (B(x+1), B(x+2), . . . , and Bn) other than the bit lines B0 to Bx, and a potential of 1 V is applied to a source line S. In such a state, at time t1, a potential of Vth or more is applied to a word line W0, and a potential difference of 1.0 V is generated across the memory cells including the memory elements A00 to A0x and the MOS transistors T00 to T0x.

Then, in order to perform erasing on the memory elements A10 to A1x, at time t2, which is after the lapse of about 1 nanosecond from time t1, a potential of Vth or more is applied to a word line W1, and a potential difference of 1.0 V is generated across the memory cells including the memory elements A10 to A1x and the MOS transistors T10 to T1x. At time t2, a potential of Vth or more is applied to the word line W0.

Then, in order to perform erasing on the memory elements A20 to A2x, at time t3, which is after the lapse of about 1 nanosecond from time t2, a potential of Vth or more is applied to a word line W2, and a potential difference of 1.0 V is generated across the memory cells including the memory elements A20 to A2x and the MOS transistors T20 to T2x. At time t3, a potential of Vth or more is applied to the word lines W0 and W1.

Then, similarly, after the lapse of about 1 nanosecond from a point in time at which a potential of Vth or more is applied to a word line connected to memory cells on which erasing is currently being performed, a potential of Vth or more is applied to a word line connected to memory cells on which erasing is to be next performed. Accordingly, erasing on the memory elements A00 to A0x, A10 to A1x, . . . , and Am0 to Amx that are connected to the bit lines B0 to Bx is performed in that order. The potential of each word line is returned to 0 V after the lapse of about 20 nanoseconds from a point in time at which a potential of Vth or more is applied, and erasing of each memory cell is completed.

After erasing on the memory elements connected to the bit lines B0 to Bx is performed as described above, in order to perform erasing on the memory elements A0(x+1) to A0(2x) connected to the bit lines B(x+1) to B(2x), the potential of the bit lines B0 to Bx is set to 1V, and the potential of the bit lines B(x+1) to B(2x) is set to 0V. Then, by performing a sequence similar to a case where erasing on the memory elements connected to the bit lines B0 to Bx is performed, erasing on the memory elements A0(x+1) to A0(2x), A1(x+1) to A1(2x), . . . , and Am(x+1) to Am(2x) that are connected to the bit lines B(x+1) to B(2x) is performed in that order. Then, erasing on memory elements connected to the other bit lines is performed in accordance with a similar sequence, and erasing on all the memory elements can be performed.

A case where erasing on memory cells is performed for each row will be described with reference to FIG. 7B.

When erasing on memory cells is performed for each row, that is, when erasing on memory elements A00, A01, . . . , and A0n that are connected to a word line W0 is performed in that order, and then, erasing on memory elements A10, A11, . . . , and A1n that are connected to a word line W1 is performed in that order, first, in order to perform erasing on the memory element A00, a potential of Vth or more is applied to the word line W0, and a potential of 1 V is applied to a source line S. In such a state, at time t1, a potential of 0 V is applied to a bit line B0, and a potential difference of 1.0 V is generated across the memory cell including the memory element A00 and the MOS transistor T00.

Then, in order to perform erasing on the memory element A01, at time t2, which is after the lapse of about 1 nanosecond from time t1, a potential of 0 V is applied to a bit line B1, and a potential difference of 1.0 V is generated across the memory cell including the memory element A01 and the MOS transistor T01. At time t2, a potential of 0 V is applied to the bit line B0.

Then, in order to perform erasing on the memory element A02, at time t3, which is after the lapse of about 1 nanosecond from time t2, a potential of 0 V is applied to a bit line B2, and a potential difference of 1.0 V is generated across the memory cell including the memory element A02 and the MOS transistor T02. At time t3, a potential of 0 V is applied to the bit lines B0 and B1.

Then, similarly, after the lapse of about 1 nanosecond from a point in time at which a potential of 0 V is applied to a bit line connected to a memory cell on which erasing is currently being performed, a potential of 0 V is applied to a bit line connected to a memory cell on which erasing is to be next performed. Accordingly, erasing on the memory elements A00, A01, . . . , and A0$n$ that are connected to the word line W0 is performed in that order. The potential of each bit line is returned to 1 V after the lapse of about 20 nanoseconds from a point in time at which a potential of 0 V is applied, and erasing of each memory cell is completed. More specifically, the potential of the bit line B0 is returned to 1 V after the lapse of about 20 nanoseconds from time t1, and the potential of the bit line B1 is returned to 1 V after the lapse of about 20 nanoseconds from time t2.

After erasing on the memory elements connected to the word line W0 is performed as described above, in order to perform erasing on the memory element A10 connected to the word line W1, the potential of the word line W0 is set to 0 V, and the potential of the word line W1 is set to Vth or more. Then, by performing a sequence similar to a case where erasing on the memory elements connected to the word line W0 is performed, erasing on the memory elements A10, A11, . . . , and A1$n$ that are connected to the word line W1 is performed in that order. Then, erasing on memory elements connected to each of the word lines W2, W3, . . . , and Wm is performed in accordance with a similar sequence, and erasing on all the memory elements can be performed.

When erasing on memory cells is performed for a plurality of rows (for y rows), that is, when erasing on memory elements A00 to Ay0, A01 to Ay1, . . . , and A0$n$ to Ay$n$ that are connected to word lines W0 to Wy (y≧2) is performed in that order, and then, erasing on memory elements A(y+1)0 to A(2y)0, A(y+1)1 to A(2y)1, . . . , and A(y+1)n to A(2y)n that are connected to word lines W(y+1) to W(2y) is performed in that order, first, in order to perform erasing on the memory elements A00 to Ay0, a potential of Vth or more is applied to the word lines W0 to Wy, and a potential of 1 V is applied to a source line S. In such a state, at time t1, a potential of 0 V is applied to a bit line B0, and a potential difference of 1.0 V is generated across the memory cells including the memory elements A00 to Ay0 and the MOS transistors T00 to Ty0.

Then, in order to perform erasing on the memory elements A01 to Ay1, at time t2, which is after the lapse of about 1 nanosecond from time t1, a potential of 0 V is applied to a bit line B1, and a potential difference of 1.0 V is generated across the memory cells including the memory elements A01 to Ay1 and the MOS transistors T01 to Ty1. At time t2, a potential of 0 V is applied to the bit line B0.

Then, in order to perform erasing on the memory elements A02 to Ay2, at time t3, which is after the lapse of about 1 nanosecond from time t2, a potential of 0 V is applied to a bit line B2, and a potential difference of 1.0 V is generated across the memory cells including the memory elements A02 to Ay2 and the MOS transistors T02 to Ty2. At time t3, a potential of 0 V is applied to the bit lines B0 and B1.

Then, similarly, after the lapse of about 1 nanosecond from a point in time at which a potential of 0 V is applied to a bit line connected to memory cells on which erasing is currently being performed, a potential of 0 V is applied to a bit line connected to memory cells on which erasing is to be next performed. Accordingly, erasing on the memory elements A00 to Ay0, A01 to Ay1, . . . , and A0$n$ to Ay$n$ that are connected to the word lines W0 to Wy is performed in that order. The potential of each bit line is returned to 1 V after the lapse of about 20 nanoseconds from a point in time at which a potential of 0 V is applied, and erasing on each memory cell is completed.

After erasing on the memory elements connected to the word lines W0 to Wy is performed as described above, in order to perform erasing on the memory elements A(y+1)0 to A(2y)0 connected to the word lines W(y+1) to W(2y), the potential of the word lines W0 to Wy is set to 0 V, and the potential of the word lines W(y+1) to W(2y) is set to 1.8 V. Then, by performing a sequence similar to a case where erasing on the memory elements connected to the word lines W0 to Wy is performed, erasing on the memory elements A(y+1)0 to A(2y)0, A(y+1)1 to A(2y)1, . . . , and A(y+1)n to A(2y)n that are connected to the word lines W(y+1) to W(2y) is performed in that order. Then, erasing on memory elements connected to the other word lines is performed in accordance with a similar sequence, and erasing on all the memory elements can be performed.

A procedure for performing sequential erasing by dividing a memory array into column-shaped regions and a procedure for performing sequential erasing by dividing a memory array into row-shaped regions have been described above. However, erasing is not necessarily performed in accordance with the above-described procedures. For example, sequential erasing may be performed by dividing a memory array into matrix-shape regions.

In the storage device according to the foregoing embodiment, erasing on a memory array can be performed at high speed by adopting a procedure for applying an erasing voltage to a memory cell on which erasing is currently being performed, and at the same time, applying an erasing voltage to a memory cell on which erasing is to be next performed, that is, by adopting a procedure for applying erasing voltages to a memory array in a superimposing manner.

A memory cell used in the storage device according to the foregoing embodiment has a feature in which the memory cell reaches a very high resistance, such as about several mega ohms in a higher resistance state. Thus, a memory cell on which erasing is completed is in the higher resistance state, and an extremely small amount of current flows even if an erasing voltage is applied. Thus, hardly any voltage drop occurs.

In other words, even if an erasing voltage is applied to a memory cell on which erasing is completed, and at the same time, an erasing voltage is applied to a memory cell on which erasing is not completed, that is, even if, after completion of erasing of a memory cell on which erasing is previously performed, an erasing voltage is applied to the memory cell, and at the same time, an erasing voltage is applied to a memory cell on which erasing is to be next performed, power consumption can be reduced.

When erasing on a plurality of memory cells is performed at the same time, currents flow to a plurality of memory cells on which erasing is not completed. Thus, it is necessary to maintain the total amount of current flowing to the memory cells not to exceed a current supply capacity of a chip. If the total amount of current flowing to memory cells exceeds the current supply capacity of the chip, a desired erasing voltage is not applied to the memory cells. In such a case, an erasing failure occurs.

As described above, for some memory cells, erasing is not completed in about 1 nanosecond. However, for a majority of memory cells, erasing is completed in about 1 nanosecond. Thus, after the lapse of 1 nanosecond from application of an erasing voltage, hardly any voltage drop occurs in a memory cell on which erasing is previously performed. Thus, by applying an erasing voltage to a memory cell on which erasing is to be next performed after the lapse of about 1 nanosecond from application of an erasing voltage to a memory cell on which erasing is previously performed, power consumption can be sufficiently reduced. In FIGS. 7A and 7B, sign "P" represents the electric energy consumed by the memory array.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device comprising:
   a plurality of memory cells disposed in a matrix, each of the plurality of memory cells including
   (a) a storage element having a resistance (1) which changes from a higher state to a lower state when a writing electric signal of a first threshold level or higher is applied to effect writing of information thereto and (2) which changes from the lower state to the higher state when an erasing electric signal of a second threshold level or higher is applied to effect erasing of information thereon, the polarity of the writing electric signal being opposite that of the erasing electric signal, and
   (b) a circuit element connected in series with the storage element, the circuit element serving as a switch and as a load,
   wherein,
   the storage device is configured such that each storage element is positioned between two voltages the selective application of the difference of which effects writing and erasing, and
   the storage device is configured such that in order to perform erasing on the memory cells, in a state in which an erasing electric signal is applied to a first predetermined unit including at least one memory cell on which erasing is currently being performed, after the lapse of a predetermined period of time since the commencement of the application of the erasing electric signal to the first predetermined unit and while erasing of said at least one memory cell is on-going, an erasing electric signal is applied to second predetermined unit including at least one memory cell on which erasing is to be performed next.

2. The storage device according to claim 1, wherein:
   the storage element includes a storage layer sandwiched between a first electrode and a second electrode;
   the resistance changes from the higher state to the lower state when the writing electric signal is applied across the first electrode and the second electrode; and
   the resistance changes from the lower state to the higher state when the erasing electric signal is applied across the first electrode and the second electrode.

3. An erasing method for a storage device including a plurality of memory cells disposed in a matrix, each of the plurality of memory cells including (a) a storage element having a storage layer sandwiched between a first electrode and a second electrode and having a characteristic in that (i) the resistance thereof changes from a higher state to a lower state when a first electric signal of a first threshold level or higher is applied across the first electrode and the second electrode and (ii) the resistance changes from the lower state to the higher state when a second electric signal of a second threshold level or higher and of a polarity opposite that of the first electric signal is applied across the first electrode and the second electrode, and (b) a circuit element connected in series with the storage element, the method comprising the step of:
   applying, in order to perform erasing on the memory cells, in a state in which an erasing voltage is applied to a first predetermined unit of memory cells including at least one memory cell on which erasing is currently being performed, an erasing voltage to second predetermined unit of memory cells including at least one memory cell on which erasing is to be next performed after the lapse of a predetermined period of time since the application of the erasing voltage to the first predetermined unit.

4. A semiconductor apparatus including a plurality of memory cells disposed in a matrix, each of the plurality of memory cells including a storage element having a characteristic in that the resistance thereof changes from a higher state to a lower state when a first electric signal of a first threshold level or higher is applied and in that the resistance changes from the lower state to the higher state when a second electric signal of a second threshold level or higher, the polarity of the second electric signal being different from the polarity of the first electric signal, is applied, and a circuit element connected in series with the storage element to act as a load, the semiconductor apparatus comprising:
   erasing voltage applying means which, in order to perform erasing on the memory cells, in a state in which an erasing voltage is applied to a first predetermined unit including at least one memory cell on which erasing is currently being performed, after the lapse of a predetermined period of time since the application of the erasing voltage to the first predetermined unit, applies an erasing voltage to a second predetermined unit including at least one memory cell on which erasing is to be next performed.

* * * * *